United States Patent
Zhou et al.

(10) Patent No.: US 12,081,176 B2
(45) Date of Patent: Sep. 3, 2024

(54) GAIN-CONTROLLABLE MAGNETORESISTIVE ANALOG AMPLIFIER

(71) Applicant: MultiDimension Technology Co., Ltd., Zhangjiagang (CN)

(72) Inventors: Zhimin Zhou, Zhangjiagang (CN); James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 133 days.

(21) Appl. No.: 17/904,515

(22) PCT Filed: Feb. 9, 2021

(86) PCT No.: PCT/CN2021/076124
§ 371 (c)(1),
(2) Date: Aug. 18, 2022

(87) PCT Pub. No.: WO2021/164269
PCT Pub. Date: Aug. 26, 2021

(65) Prior Publication Data
US 2023/0084058 A1  Mar. 16, 2023

(30) Foreign Application Priority Data
Feb. 18, 2020  (CN) .......................... 202010098935.3

(51) Int. Cl.
*H03F 1/34* (2006.01)
*G01R 33/00* (2006.01)
*G01R 33/09* (2006.01)

(52) U.S. Cl.
CPC ........... *H03F 1/34* (2013.01); *G01R 33/0094* (2013.01); *G01R 33/091* (2013.01)

(58) Field of Classification Search
CPC .............................. H03F 1/34; G01R 33/0094
(Continued)

(56) References Cited

U.S. PATENT DOCUMENTS 5,917,680 A * 6/1999 Valstyn .................... G11B 5/02
9,116,195 B2   8/2015 Yamashita et al.
(Continued)

FOREIGN PATENT DOCUMENTS

CN     101641609 A    2/2010
CN     103414176      11/2013
(Continued)

OTHER PUBLICATIONS

"International Application No. PCT/CN2021/076124, International Search Report and Written Opinion mailed May 7, 2021", (May 7, 2021), 10 pgs.

*Primary Examiner* — Vincent Q Nguyen
(74) *Attorney, Agent, or Firm* — Schwegman Lundberg & Woessner, P.A.

(57) ABSTRACT

A gain-controllable magnetoresistive analog amplifier includes a substrate in an X-Y plane, an output signal magnetoresistive sensor on the substrate, and an input signal coil and a gain adjustment coil. The input signal coil and the gain adjustment coil are respectively on two side surfaces of the sensor. The gain adjustment coil is used to input a gain signal by the generation of a gain magnetic field, in order to set the gain the magnetic field is applied along a magnetization direction of a free layer of the output signal magnetoresistive sensor. The input signal coil is used for inputting a current signal to generate an input magnetic field, in order to apply the input magnetic field to a magnetization direction of a pinned layer of the output signal magnetoresistive sensor. This amplifier provides isolation between input signals, output signals, and controllable gain signals.

11 Claims, 8 Drawing Sheets

(58) Field of Classification Search
USPC .......................................... 324/252, 207.21
See application file for complete search history.

(56) References Cited

U.S. PATENT DOCUMENTS

| | | |
|---|---|---|
| 9,748,025 B2 | 8/2017 | Zhou et al. |
| 2010/0117638 A1 | 5/2010 | Yamashita et al. |
| 2015/0316638 A1 | 11/2015 | Yamashita et al. |
| 2016/0163431 A1 | 6/2016 | Zhou et al. |
| 2019/0280650 A1* | 9/2019 | Deak .................. H03D 7/14 |

FOREIGN PATENT DOCUMENTS

| | | |
|---|---|---|
| CN | 110412118 A | 11/2019 |
| CN | 111277231 A | 6/2020 |
| JP | H06294853 A | 10/1994 |
| WO | WO-2021164629 A1 | 8/2021 |

* cited by examiner

GAIN-CONTROLLABLE MAGNETORESISTIVE ANALOG AMPLIFIER

PRIORITY CLAIM TO RELATED APPLICATIONS

This application is a U.S. national stage filing under 35 U.S.C. § 371 from International Application No. PCT/CN2021/076124, filed on 9 Feb. 2021, and published as WO2021/164629 on 26 Aug. 2021, which claims the benefit under 35 U.S.C. 119 to Chinese Application No. 202010098935.3, filed on 18 Feb. 2020, the benefit of priority of each of which is claimed herein, and which applications and publication are hereby incorporated herein by reference in their entirety.

TECHNICAL FIELD

Embodiments of the present disclosure relate to magnetic sensor technology, and more particularly, to a gain-controllable magnetoresistive analog amplifier.

BACKGROUND

Modern electronic technology typically uses a bipolar transistor, a field emission transistor, or a CMOS integrated circuit chip as an amplifier to achieve amplification of an input signal.

In actual use, a transistor typically has a common electrode between a base, a collector, and an emitter thereof when the transistor is in an amplification region, and the mutual relationship between an emitter current, a collector current, a base current, and a voltage is realized by controlling the distribution of carriers in different regions and the opening and suppression of a channel by an electric field, so input signals and output signals cannot be completely isolated.

SUMMARY OF THE INVENTION

The embodiments of the present disclosure provide a gain-controllable magnetoresistive analog amplifier to realize the isolation between input signals and output signals.

The embodiments of the present disclosure provide a gain-controllable magnetoresistive analog amplifier, comprising:

a substrate located in an X-Y plane;

an output signal magnetoresistive sensor located on the substrate;

an input signal coil and a gain adjustment coil, the signal coil and the gain adjustment coil located on two side surfaces of the output signal magnetoresistive sensor, respectively, wherein the gain adjustment coil is used to input a gain signal by the generation of a gain magnetic field, in order to set the gain magnetic field is applied along a magnetization direction of a free layer of the output signal magnetoresistive sensor, thereby adjusting the slope of the input resistance-magnetic field transfer curve of the output signal magnetoresistive sensor; and the input signal coil is used for inputting a current signal to generate an input magnetic field, in order to apply the input magnetic field to a magnetization direction of a pinned layer of the output signal magnetoresistive sensor, thereby controlling the gain signal to adjust a gain factor of an output signal after the current signal passes through the output signal magnetoresistive sensor, and the current signal is an alternate current signal or direct current signal.

In the embodiments of the present disclosure, an input signal coil and an gain adjustment coil are respectively located on two side surfaces of an output signal magnetoresistive sensor, and in operation, a gain signal is input to the gain adjustment coil and a gain magnetic field is generated, an alternate current signal or direct current signal is input to the input signal coil and an input magnetic field is generated, thereby a magnetic signal is generated through the coil current signal, so an amplifier has independent power supply and output signal, and the relationship between the two is magnetically coupled to realize complete isolation between input signals and output signals; applying the input magnetic field to a magnetization direction of a pinned layer of the output signal magnetoresistive sensor and applying the gain magnetic field to a magnetization direction of a free layer of the output signal magnetoresistive sensor so that an external magnetic field signal changes, the magnetoresistance change rate can reach 200%, the gain factor of the output signal after the input current signal passes through the output signal magnetoresistive sensor can be adjusted by controlling the gain signal, thereby the gain of the output signal of the amplifier is controllable.

BRIEF DESCRIPTION OF THE DRAWINGS

In order to more clearly illustrate the technical solutions in the embodiments of the present disclosure or the prior art, the following is a brief description of the drawings to be used in the description of the embodiments or the prior art, and it is obvious that, while the drawings in the following description are some specific embodiments of the present disclosure, it is possible for those skilled in the art to expand and extend the basic concepts of device structures, drive methods, and manufacturing methods revealed and suggested by the various embodiments of the present disclosure to other structures and accompanying drawings that are undoubtedly within the scope of the claims of the present disclosure.

DETAILED DESCRIPTION

Figure 1:
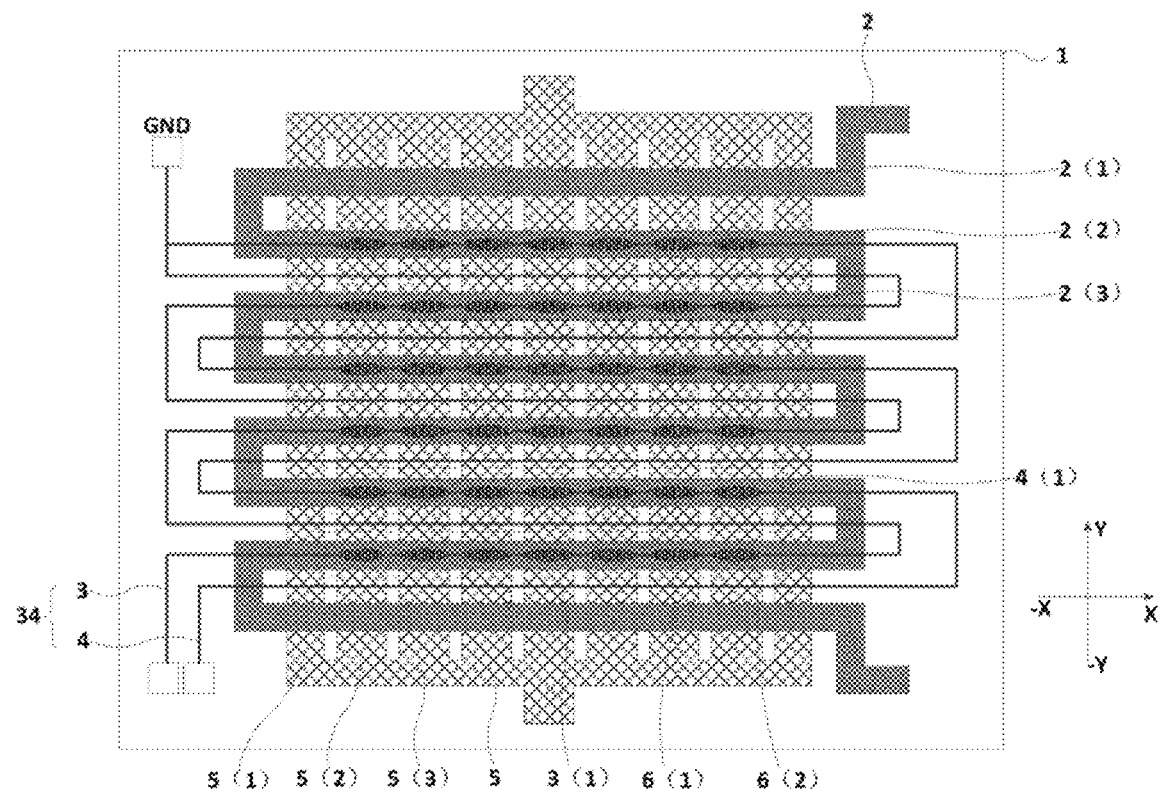
FIG. 1 is a schematic diagram of a gain-controllable magnetoresistive analog amplifier provided by an embodiment of the present disclosure.

In order to make the purpose, technical solution, and advantages of the present disclosure clearer, the technical solutions of the present disclosure will be described clearly and completely by way of implementation with reference to the drawings in the embodiments of the present disclosure, and it is obvious that the embodiments described are some of the embodiments of the present disclosure, not all of them. Based on the basic concepts revealed and suggested by the embodiments of the present disclosure, all other embodiments available for those skilled in the art are within the scope of protection of the present disclosure.

The embodiments of the disclosure provide a gain-controllable magnetoresistive analog amplifier, comprising: a substrate located in an X-Y plane; an output signal magnetoresistive sensor located on the substrate; an input signal coil and a gain adjustment coil, the input signal coil and the gain adjustment coil being respectively located on two side surfaces of the output signal magnetoresistive sensor, wherein the gain adjustment coil is used to input a gain signal by the generation of a gain magnetic field, in order to set the gain magnetic field is applied along a magnetization direction of a free layer of the output signal magnetoresistive sensor, thereby adjusting the slope of the input resistance-magnetic field transfer curve of the output signal magnetoresistive sensor. the input signal coil is used for inputting a current signal to generate an input magnetic field, in order to apply the input magnetic field to a magnetization direction of a pinned layer of the output signal magnetoresistive sensor, thereby controlling the gain signal to adjust a gain factor of an output signal after the current signal passes through the output signal magnetoresistive sensor, and the current signal is an alternate current signal or direct current signal.

In the embodiment, the magnetoresistive analog amplifier is optionally a tunneling magnetoresistive analog amplifier, wherein an output signal magnetoresistive sensor located on a substrate and an input signal coil and a gain adjustment coil are included, and a magnetoresistive sensor for the output signal is named the output signal magnetoresistive sensor, and the magnetoresistive sensor is optionally a tunneling magnetoresistive sensor based on tunneling magnetoresistive technology. The input signal coil and the gain adjustment coil are respectively located on two side surfaces of the output signal magnetoresistive sensor, specifically, the input signal coil is located between the substrate and the output signal magnetoresistive sensor and the gain adjustment coil is located on the output signal magnetoresistive sensor, or the gain adjustment coil is located between the substrate and the output signal magnetoresistive sensor and the input signal coil is located on the output signal magnetoresistive sensor.

The tunneling magnetoresistive sensor has the advantages of high resistance, high magnetic sensitivity, and low power consumption, and can quickly respond to an external magnetic field. The working principle is that the change of the magnetic field leads to the change of the angle between a free layer and a pinned layer, which in turn leads to the change of the probability of spin electrons passing through, causing the change of the resistance. The characteristics of the tunneling magnetoresistive sensor are that if a magnetic signal is generated through a coil current signal, the tunneling magnetoresistive sensor has independent power supply and output signal, and the relationship between the two is magnetically coupled to realize complete isolation between input signals and output signals. The magnetic signal of an amplifier using the tunneling magnetoresistive sensor is generated by the current signal of the input signal coil, so the amplifier can realize the isolation between input signals and output signals; Secondly, the magnetoresistive sensing unit of the tunneling magnetoresistive sensor has a resistivity of KOhm or even MOhm, and the magnetoresistance change rate of the magnetoresistive sensing unit can reach 200% when an external magnetic field signal changes, so the output signal has a wide range of change, and the change of resistance is converted into the change of voltage by using the method of constant current source to realize gain control. For the amplifier using the tunneling magnetoresistive sensor, by adjusting a gain signal in the coil by controlling the gain, the change in magnetoresistance of the magnetoresistive sensor can be adjusted, which in turn affects a gain factor, so the amplifier can realize gain factor control; and thirdly, the frequency range of the tunneling magnetoresistive sensor can reach MHz, so it does not affect the frequency band of the amplifier.

The gain of the tunneling magnetoresistive sensor is related to the external magnetic field sensitivity in addition to the magnetoresistance change rate and the constant current source, and the gain factor of the amplifier can be controlled by controlling the external magnetic field sensitivity of the tunneling magnetoresistive sensor. The magnetic field sensitivity of the magnetoresistive sensing unit in the tunneling magnetoresistive sensor is related to an anisotropy field Hk of the free layer, a shape anisotropy field Ha of the magnetoresistive sensing unit, and a bias magnetic field Hb of the free layer; the free layer bias field Hb is related to a permanent magnet bias field Hpm or an exchange coupling field Hex, and the external magnetic field can be generated by the bias current coil to realize Hb, so the sensitivity of the tunneling magnetoresistive sensor can be controlled by controlling the current of the bias current coil, that is, the input signal coil, and the gain adjustment coil, which in turn controls the gain factor of the amplifier.

In the embodiments of the present disclosure, an input signal coil and an gain adjustment coil are respectively located on two side surfaces of an output signal magnetoresistive sensor, and in operation, a gain signal is input to the gain adjustment coil and a gain magnetic field is generated, an alternate current signal or direct current signal is input to the input signal coil and an input magnetic field is generated, thereby a magnetic signal is generated through the coil current signal, so the amplifier has independent power supply and output signal, and the relationship between the two is magnetically coupled to realize complete isolation between input signals and output signals; applying the input magnetic field to a magnetization direction of a pinned layer of the output signal magnetoresistive sensor and applying the gain magnetic field to a magnetization direction of a free layer of the output signal magnetoresistive sensor so that an external magnetic field signal changes, the magnetoresistance change rate can reach 200%, the gain factor of the output signal after the input current signal passes through the output signal magnetoresistive sensor can be adjusted by controlling the gain signal, thereby the gain of the output signal of the amplifier is controllable. The amplifier using the magnetoresistive sensor in the embodiments of the present disclosure also has the advantages of low power consumption, small size, and mass production.

The above is the general idea and principle of the embodiments of the present disclosure and a variety of different magnetoresistive analog amplifiers are given below.

As an example, based on the above technical solution, the output signal magnetoresistive sensor optionally includes 1 M row*N column magnetoresistive sensing unit array; the input signal coil is curved serpentine-shaped and contains M+2 input signal straight wires with opposite current directions and arranged alternately, the long axis of the input signal straight wires is parallel to the X direction and the short axis is parallel to the Y direction, and the current direction of the input signal straight wires is parallel to the X direction. The M rows of magnetoresistive sensing units of the output signal magnetoresistive sensor are respectively set in correspondence with the M input signal straight wires located in the middle of the M+2 input signal straight wires, M/2 rows of magnetoresistive sensing units corresponding to M/2 input signal straight wires having the same first current direction in the M input signal straight wires are connected to form a push arm, and M/2 rows of magnetoresistive sensing units corresponding to the M/2 input signal straight wires having the same second current direction in the M input signal straight wires are connected to form a pull arm, and the first current direction is opposite to the second current direction. M is an even number.

Referring to FIG. 1, the gain-controllable magnetoresistive analog amplifier includes: a substrate 1 located in an X-Y plane, and a magnetoresistive sensor 34 located on the substrate 1, where the magnetoresistive sensor 34 contains an array of M rows*N columns of magnetoresistive sensing units, and the array of magnetoresistive sensing units forms a quasi-bridge structure containing a push magnetoresistive sensing unit arm 3 and a pull magnetoresistive sensing unit arm 4, and the push magnetoresistive sensing unit arm 3 and the pull magnetoresistive sensing unit arm 4 have a common ground terminal GND. The push magnetoresistive sensing unit arm 3 includes a plurality of push magnetoresistive sensing unit strings 3(1) connected in series, and one push magnetoresistive sensing unit string 3(1) consists of one row of push magnetoresistive sensing units 6(1) connected in series; the pull magnetoresistive sensing unit arm 4 includes a plurality of pull magnetoresistive sensing unit strings 4(1) connected in series, and one pull magnetoresistive sensing unit string 4(1) consists of one row of pull magnetoresistive sensing units 6(2) connected in series.

The input signal coil 2 is located above or below the magnetoresistive sensor 34, is curved serpentine-shaped, and includes M+2 input signal straight wires, wherein they are divided into two input signal straight wires 2(1) located at two ends and M input signal straight wires located in the middle, and the M input signal straight wires located in the middle include alternately arranged input signal straight wires 2(2) and 2(3). The long axis of the input signal straight wire is parallel to the X direction and the short axis is parallel to the Y direction, and the current direction is parallel to the X direction. It is obvious that the input signal straight wires 2(2) and 2(3) have opposite current directions, wherein the current direction of the input signal straight wires 2(3) is the +X direction, that is, the first current direction, and optionally the current direction of the input signal straight wires 2(2) is the −X direction, that is, the second current direction.

Push magnetoresistive sensing unit string 3(1) and pull magnetoresistive sensing unit string 6(2) are a total of M magnetoresistive sensing unit strings, with the same magnetic field sensitivity direction, both being the same Y direction, the M magnetoresistive sensing unit strings, that is, M rows of magnetoresistive sensing units and M+2 input signal straight wires in the middle of the M input signal straight wires are correspondingly set, respectively, that is, a row of magnetoresistive sensing units is located on the surface of an input signal straight wire. Specifically, the push arm, that is, the push magnetoresistive sensing unit arm 3, is formed by connecting M/2 rows of magnetoresistive sensing units corresponding to the M/2 input signal straight wires having +X direction located in the middle of the M input signal straight wires, so the pushing magnetoresistive sensing unit string 3(1) is located on the surface of the input signal straight wire 2(3); and the pull arm, that is, the pull magnetoresistive sensing unit arm 4, is formed by connecting M/2 rows of magnetoresistive sensing units corresponding to the M/2 input signal straight wires having −X direction located in the middle of the M input signal straight wires, so the pulling magnetoresistive sensing unit string 4(1) is located on the surface of the input signal straight wire 2(2).

Optionally, the gain adjustment coil 5 is grid-shaped and contains N+2 gain straight wires arranged in parallel at equal distance and having the same current direction, the long axis of the gain straight wires is parallel to the Y direction and the short axis is parallel to the X direction, the current direction of the gain straight wires is parallel to the Y direction; The N rows of magnetoresistive sensing units of the output signal magnetoresistive sensor are set in correspondence with the N gain straight wires in the middle of the N+2 gain straight wires. The gain adjustment coil 5 is located below or above the magnetoresistive sensor 34 and is divided into two gain straight wires 5(1) located at two ends and N gain straight wires located in the middle, the N gain straight wires located in the middle include alternately arranged gain straight wires 5(2) and 5(3). The current directions of the gain straight wires are all +Y or −Y direction.

As an example, based on the above technical solution, the output signal magnetoresistive sensor optionally includes 1 M row*N column magnetoresistive sensing unit array; and the input signal coil is curved serpentine-shaped and contains 2M+2 input signal straight wires with opposite current directions and arranged alternately, the long axis of the input signal straight wires is parallel to the X direction and the short axis is parallel to the Y direction, and the current direction of the input signal straight wires is parallel to the X direction. The M rows of magnetoresistive sensing units of the output signal magnetoresistive sensor are set in correspondence with the M input signal straight wires located in the middle of the 2M+2 input signal straight wires and having the same direction, and the M rows of magnetoresistive sensing units are connected to form a single arm.

Figure 2:
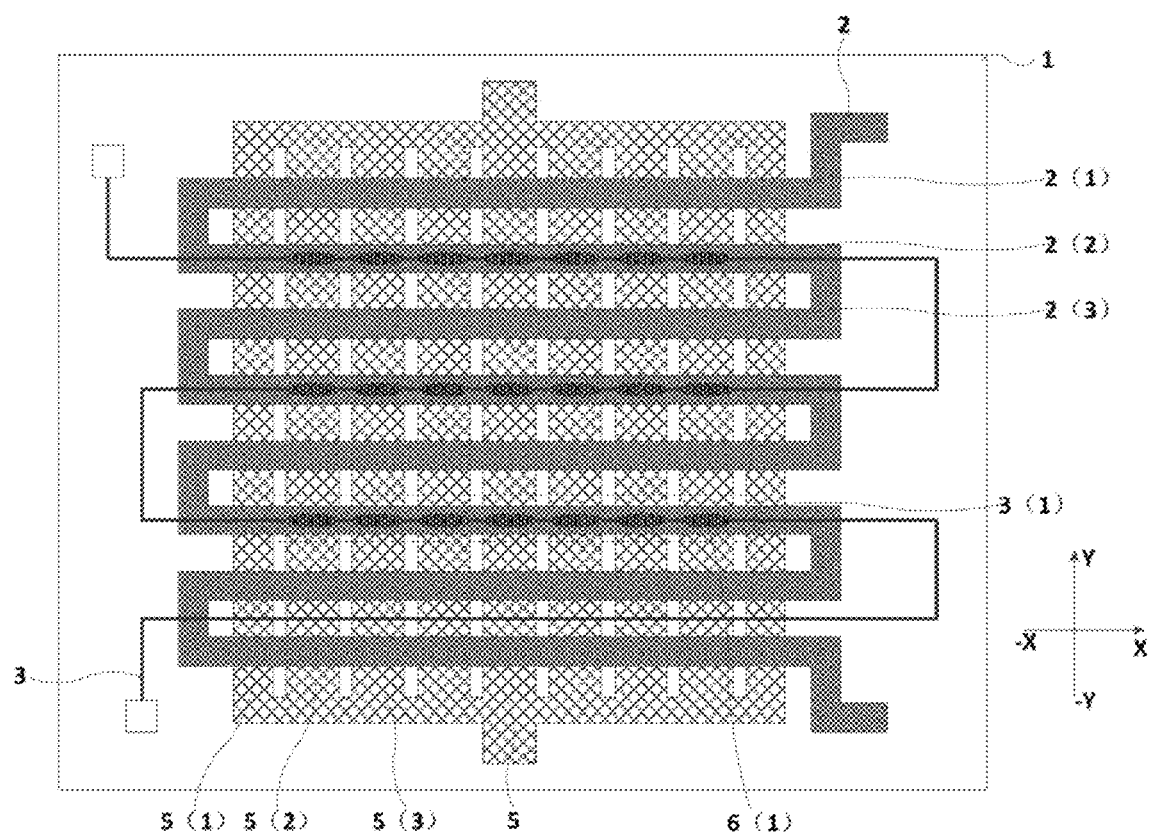
FIG. 2 is a schematic diagram of a gain-controllable magnetoresistive analog amplifier provided by an embodiment of the present disclosure.

Referring to FIG. 2, the gain-controllable magnetoresistive analog amplifier includes: a substrate 1 located in an X-Y plane, and a magnetoresistive sensor 3 located on the substrate 1, where the magnetoresistive sensor 3 contains an array of M rows*N columns of magnetoresistive sensing units, and the array of magnetoresistive sensing units forms a single magnetoresistive sensing unit arm, that is, a single arm. The single arm includes M magnetoresistive sensing unit strings 3(1) connected in series, and one magnetoresistive sensing unit string 3(1) consists of one row of magnetoresistive sensing units 6(1) connected in series.

The input signal coil 2 is located above or below the magnetoresistive sensor, is curved serpentine-shaped, and includes 2M+2 input signal straight wires, wherein they are divided into two input signal straight wires 2(1) located at two ends and 2M input signal straight wires located in the middle, and the 2M input signal straight wires located in the middle include alternately arranged input signal straight wires 2(2) and 2(3). The long axis of the input signal straight wires is parallel to the X direction and the short axis is parallel to the Y direction, and the current direction is parallel to the X direction. It is obvious that the input signal straight wires 2(2) and 2(3) have opposite current directions, wherein the current direction of the input signal straight wires 2(3) is optionally the +X direction, and the current direction of the input signal straight wires 2(2) is the −X direction.

The magnetoresistive sensing units 6(1) in the single arm have the same magnetic field sensitivity direction, all being the same Y direction, and the M magnetoresistive sensing unit strings 3(1), that is, M rows of magnetoresistive sensing units, are set in correspondence with M input signal straight wires having the same current direction in the middle 2M input signal straight wires, that is, one row of magnetoresistive sensing units is located on the surface of one input signal straight wire. For example, the M magnetoresistive sensing unit strings 3(1), that is, the M rows of magnetoresistive sensing units, and the M input signal straight wires 2(2) having the same current direction are correspondingly set, respectively, or the M magnetoresistive sensing unit strings 3(1), that is, the M rows of magnetoresistive sensing units, and the M input signal straight wires 2(3) having the same current direction are correspondingly set, respectively.

Optionally, the gain adjustment coil 5 is grid-shaped and contains N+2 gain straight wires arranged in parallel at equal distance and having the same current direction, the long axis of the gain straight wires is parallel to the Y direction and the short axis is parallel to the X direction, the current direction of the gain straight wires is parallel to the Y direction; the N rows of magnetoresistive sensing units of the output signal magnetoresistive sensor are set in correspondence with the N gain straight wires in the middle of the N+2 gain straight wires. The gain adjustment coil 5 is located below or above the magnetoresistive sensor 3 and is divided into two gain straight wires 5(1) located at two ends and N gain straight wires located in the middle, the N gain straight wires located in the middle include alternately arranged gain straight wires 5(2) and 5(3). The current directions of the gain straight wires are all +Y or −Y direction.

As an example, based on the above technical solution, the output signal magnetoresistive sensor optionally includes 1 M row*N column magnetoresistive sensing unit array; and the input signal coil is grid-shaped and contains M+2 input signal straight wires with the same current direction and arranged in parallel at equal distance, the long axis of the input signal straight wires is parallel to the X direction and the short axis is parallel to the Y direction, and the current direction of the input signal straight wires is parallel to the X direction. The M rows of magnetoresistive sensing units of the output signal magnetoresistive sensor are respectively set in correspondence with the M input signal straight wires located in the middle of the M+2 input signal straight wires, and the M rows of magnetoresistive sensing units are connected to form a single arm.

Figure 3:
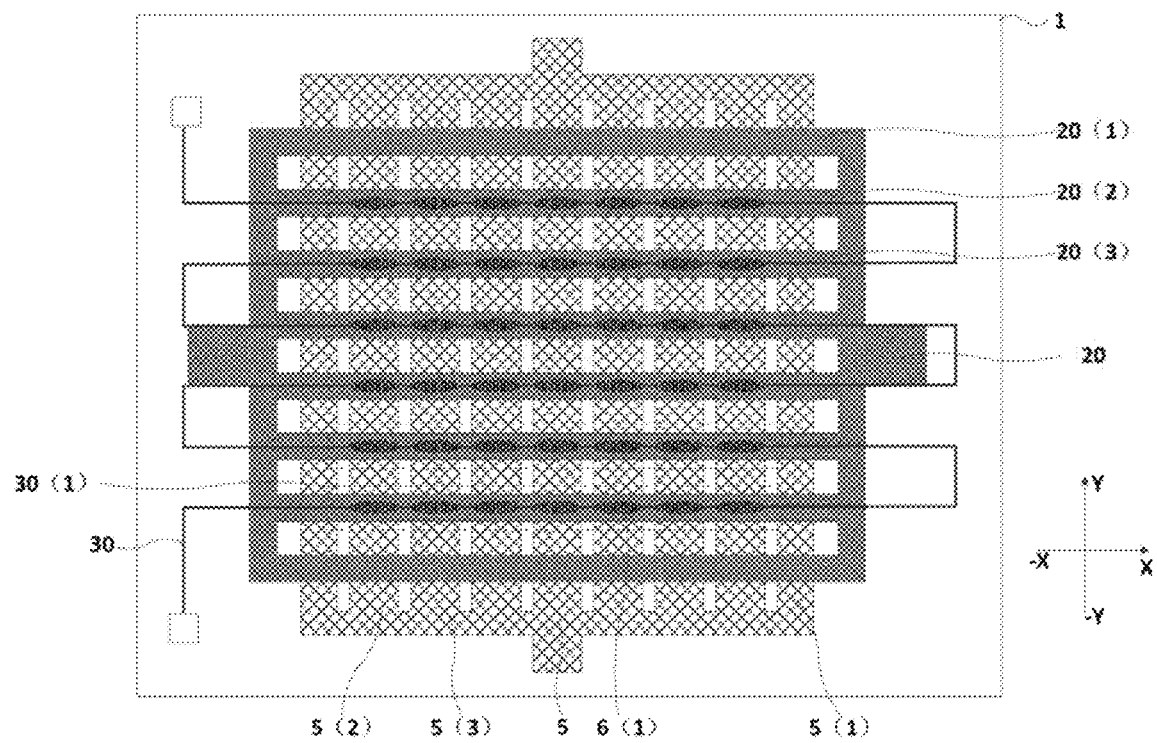
FIG. 3 is a schematic diagram of a gain-controllable magnetoresistive analog amplifier provided by an embodiment of the present disclosure.

Referring to FIG. 3, the gain-controllable magnetoresistive analog amplifier includes: a substrate 1 located in an X-Y plane, and a magnetoresistive sensor 30 located on the substrate 1, where the magnetoresistive sensor 30 contains an array of M rows*N columns of magnetoresistive sensing units, and the array of magnetoresistive sensing units forms a single magnetoresistive sensing unit arm, that is, a single arm. The single arm includes M magnetoresistive sensing unit strings 31(1) connected in series, and one magnetoresistive sensing unit string 31(1) consists of one row of magnetoresistive sensing units 6(1) connected in series.

The input signal coil 20 is located above or below the magnetoresistive sensor 30, is grid-shaped, and includes M+2 input signal straight wires, wherein they are divided into two input signal straight wires 20(1) located at two ends and M input signal straight wires located in the middle, and the M input signal straight wires located in the middle include alternately arranged input signal straight wires 20(2) and 20(3). The long axis of the input signal straight wires is parallel to the X direction and the short axis is parallel to the Y direction, the current direction is parallel to the X direction, and the input signal straight wires have the same current direction, all being +X or −X current direction.

The magnetoresistive sensing units 6(1) in the single arm have the same pinned layer direction and free layer magnetization direction, that is, the same magnetic field sensitivity direction, all being Y direction. The M magnetoresistive sensing unit string 31(1), that is, M rows of magnetoresistive sensing units are respectively set in correspondence with M input signal straight wires located in the middle, that is, one row of magnetoresistive sensing units is located on the surface of one input signal straight wire.

Optionally, the gain adjustment coil 5 is grid-shaped and contains N+2 gain straight wires arranged in parallel at equal distance and having the same current direction, the long axis of the gain straight wires is parallel to the Y direction and the short axis is parallel to the X direction, and the current direction of the gain straight wires is parallel to the Y direction; the N rows of magnetoresistive sensing units of the output signal magnetoresistive sensor are respectively set in correspondence with the N gain straight wires in the middle of the N+2 gain straight wires. The gain adjustment coil 5 is located below or above the magnetoresistive sensor 30 and is divided into two gain straight wires 5(1) located at two ends and N gain straight wires located in the middle, and the N gain straight wires located in the middle include alternately arranged gain straight wires 5(2) and 5(3). The current directions of the gain straight wires are all +Y or −Y direction. The N rows of magnetoresistive sensing units are respectively located below or above the N gain straight wires. In other embodiments, optionally, the M rows N columns of magnetoresistive sensing units can also be connected in series, in parallel, or in series-parallel to form a two-port structure.

As an example, based on the above technical solution, the output signal magnetoresistive sensor optionally includes 2 M row*N column magnetoresistive sensing unit arrays; the input signal coil is planar spiral-shaped and contains an input signal first region with M rows of input signal straight wires arranged in parallel at equal distance and an input signal second region with M rows of input signal straight wires arranged in parallel at equal distance, the input signal straight wires in the input signal first region and the input signal second region have opposite current directions, the long axis of the input signal wires is parallel to the X direction and the short axis is parallel to the Y direction, and the current direction of the input signal straight wires is parallel to the X direction; and a row of magnetoresistive sensing units is set in correspondence with an input signal straight wire, and M rows of magnetoresistive sensing units corresponding to M input signal straight wires in the input signal first region are connected to form a push arm, and M rows of magnetoresistive sensing units corresponding to M input signal straight wires in the input signal second region are connected to form a pull arm.

Figure 4:
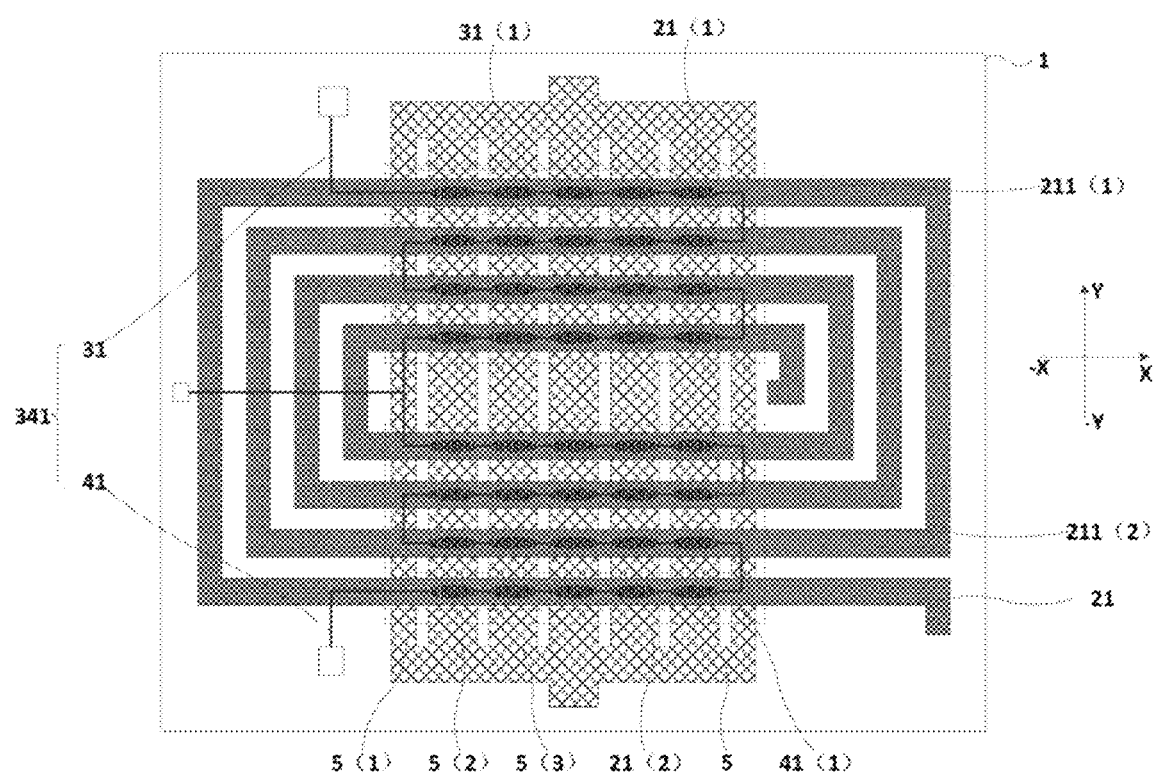
FIG. 4 is a schematic diagram of a gain-controllable magnetoresistive analog amplifier provided by an embodiment of the present disclosure.

Referring to FIG. 4, the gain-controllable magnetoresistive analog amplifier includes: a substrate 1 located in an X-Y plane, and a magnetoresistive sensor 341 located on the substrate 1, where the magnetoresistive sensor 341 contains 2 M row*N column magnetoresistive sensing unit arrays arranged in the Y-direction. A magnetoresistive sensing unit array forms a push arm 31, another magnetoresistive sensing unit array forms a pull arm 41, and both the push arm 31 and the pull arm 41 are two-port bridge arms. The push arm 31 includes a plurality of push magnetoresistive sensing unit strings 31(1) connected in series, and one push magnetoresistive sensing unit string 31(1) consists of one row of push magnetoresistive sensing units connected in series; the pull arm 41 includes a plurality of pull magnetoresistive sensing unit strings 41(1) connected in series, and one pull magnetoresistive sensing unit string 41(1) consists of one row of pull magnetoresistive sensing units connected in series.

The input signal coil 21 is located above or below the magnetoresistive sensor 341, is planar spiral-shaped, and includes two input signal regions, respectively the input signal first region 21(1) and the input signal second region 21(2), both input signal regions 21(1) and 21(2) including M input signal straight wires 211 (1) and 211(2) arranged in parallel at equal distance and having the same current direction. The long axis of the input signal straight wires is parallel to the X direction and the short axis is parallel to the Y direction, and the current direction is parallel to the X direction. It is obvious that the input signal straight wires 211(1) and 211(2) have opposite current directions, and optionally, the current direction of the input signal straight wires 211(1) is +X direction and the current direction of the input signal straight wires 211(2) is −X direction. A magnetoresistive sensing unit string is set in correspondence with an input signal straight wire, and is located above or below the input signal straight wire.

Optionally, the gain adjustment coil 5 is grid-shaped and contains N+2 gain straight wires arranged in parallel at equal distance and having the same current direction, the long axis of the gain straight wires is parallel to the Y direction and the short axis is parallel to the X direction, and the current direction of the gain straight wires is parallel to the Y direction; the N rows of magnetoresistive sensing units of the output signal magnetoresistive sensor are respectively set in correspondence with the N gain straight wires in the middle of the N+2 gain straight wires. The gain adjustment coil 5 is located below or above the magnetoresistive sensor 341 and is divided into two gain straight wires 5(1) located at two ends and N gain straight wires located in the middle, the N gain straight wires located in the middle include alternately arranged gain straight wires 5(2) and 5(3). The current directions of the gain straight wires are all +Y or −Y direction.

In 1 M row*N column magnetoresistive sensing unit array, the M rows of magnetoresistive sensing units are all located on the upper or lower surfaces of the M input signal straight wires in the input signal first region 21(1), and in the other M row*N column magnetoresistive sensing unit array, the M rows of magnetoresistive sensing units are all located on the upper or lower surfaces of the M input signal straight wires in the input signal second region 21(2). N columns of magnetoresistive sensing units are respectively located on the lower or upper surfaces of the middle N gain straight wires in the gain coil 5, and all magnetoresistive sensing units have the same magnetic field sensitivity direction. As an example, based on the above technical solution, the output signal magnetoresistive sensor optionally includes 1 M row*N column magnetoresistive sensing unit array; the input signal coil is planar spiral-shaped and contains one input signal region, the input signal region having M rows of input signal straight wires arranged in parallel at equal distance and having the same current direction, the long axis of the input signal straight wires is parallel to the X direction and the short axis is parallel to the Y direction, and the current direction of the input signal straight wires is parallel to the X direction; and a row of magnetoresistive sensing units is set in correspondence with one input signal straight wire, and the M row of magnetoresistive sensing units are connected to form a single arm.

Figure 5:
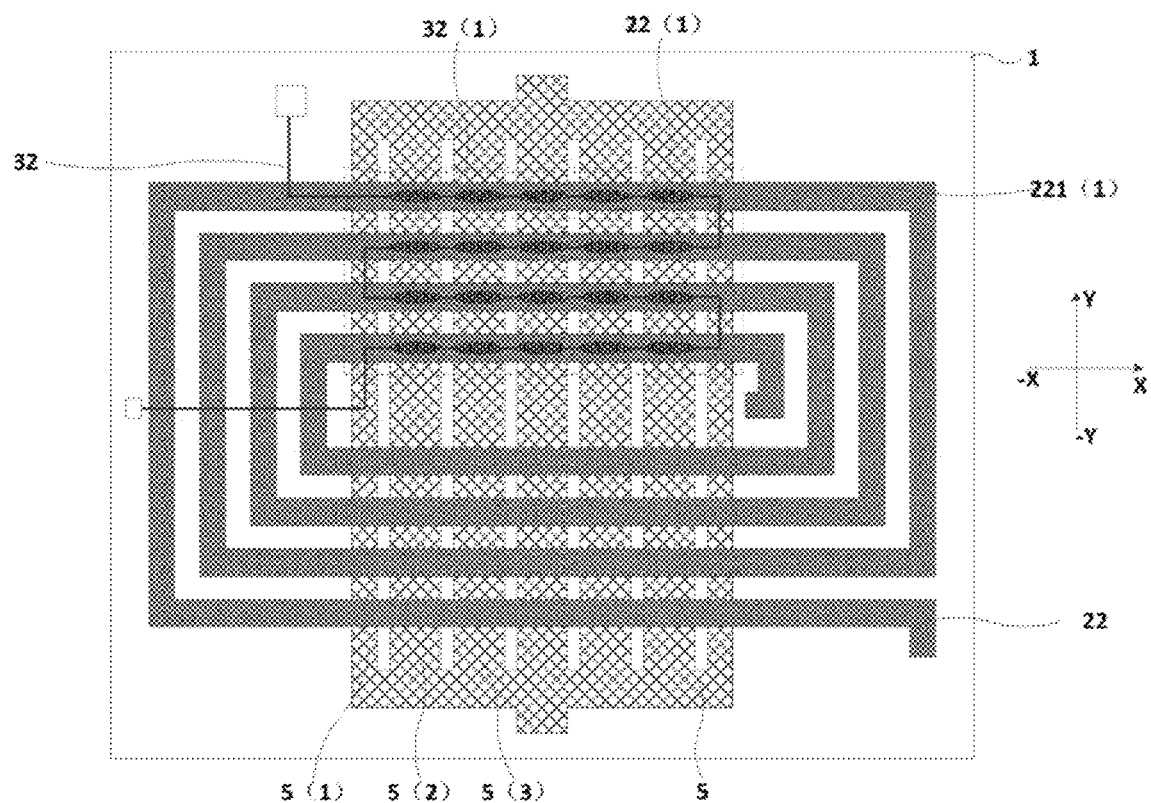
FIG. 5 is a schematic diagram of a gain-controllable magnetoresistive analog amplifier provided by an embodiment of the present disclosure.

Referring to FIG. 5, the gain-controllable magnetoresistive analog amplifier includes: a substrate 1 located in an X-Y plane, and a magnetoresistive sensor located on the substrate 1, where the magnetoresistive sensor contains 1 M row*N column magnetoresistive sensing unit array. The magnetoresistive sensing unit array forms a single arm 32, and the single arm 32 is two-port bridge arms. The single arm 32 includes M magnetoresistive sensing unit strings 32(1) connected in series, and one magnetoresistive sensing unit string 32(1) consists of one row of magnetoresistive sensing units connected in series.

The input signal coil 22 is located above or below the magnetoresistive sensor, is planar spiral-shaped, and includes one input signal region 22(1), the input signal region 22(1) including M input signal straight wires 221(1) arranged in parallel at equal distance and having the same current direction. The long axis of the input signal straight wires is parallel to the X direction and the short axis is parallel to the Y direction, the current direction is parallel to the X direction, and the current directions of the input signal straight wires 221(1) are all +X direction or −X direction. A magnetoresistive sensing unit string is set in correspondence with an input signal straight wire, and is located above or below the input signal straight wire.

Optionally, the gain adjustment coil 5 is grid-shaped and contains N+2 gain straight wires arranged in parallel at equal distance and having the same current direction, the long axis of the gain straight wires is parallel to the Y direction and the short axis is parallel to the X direction, and the current direction of the gain straight wires is parallel to the Y direction; the N rows of magnetoresistive sensing units of the output signal magnetoresistive sensor are respectively set in correspondence with the N gain straight wires in the middle of the N+2 gain straight wires. The gain adjustment coil 5 is located below or above the magnetoresistive sensor and is divided into two gain straight wires 5(1) located at two ends and N gain straight wires located in the middle, the N gain straight wires located in the middle include alternately arranged gain straight wires 5(2) and 5(3). The current directions of the gain straight wires are all +Y or −Y direction. N columns of magnetoresistive sensing units are respectively located on the lower or upper surfaces of the middle N gain straight wires in the gain coil 5, and all the magnetoresistive sensing units have the same magnetic field sensitivity direction.

For the magnetoresistive analog amplifiers provided in the above plurality of embodiments, there are various ways to connect the bridge arms in the magnetoresistive sensors, which can be in series, in parallel, or a mixture of series and parallel connections, and only part of the connection structures is shown above.

Figure 6A:
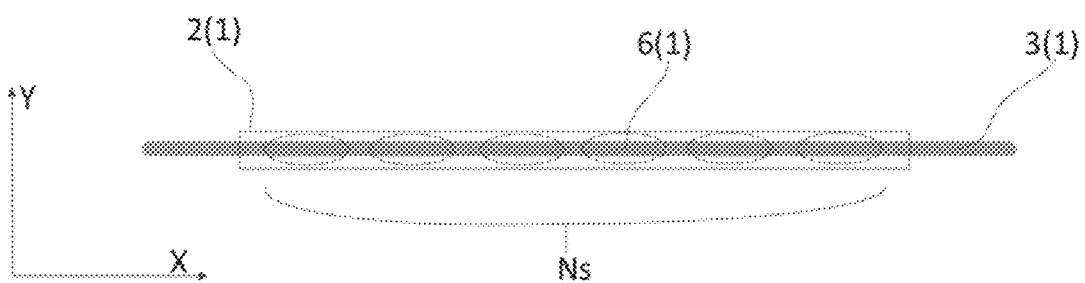
FIG. 6a is a connection diagram of series-connected magnetoresistive sensing units.

FIG. 6a shows a connection diagram of magnetoresistive sensing unit in series, Ns magnetoresistive sensing units 6(1) are connected in series with one another to form a magnetoresistive sensing unit string 3(1), and are located on the upper or lower surface of the input signal straight wire 2(1), and in the case, a plurality of magnetoresistive sensing unit strings 3(1) are connected in series to form a bridge arm. The advantage is that the bridge arm is powered by a constant current source, so the series connection can increase the total resistance of the magnetoresistive sensor and increase the total voltage of the output signal.

Figure 6B:
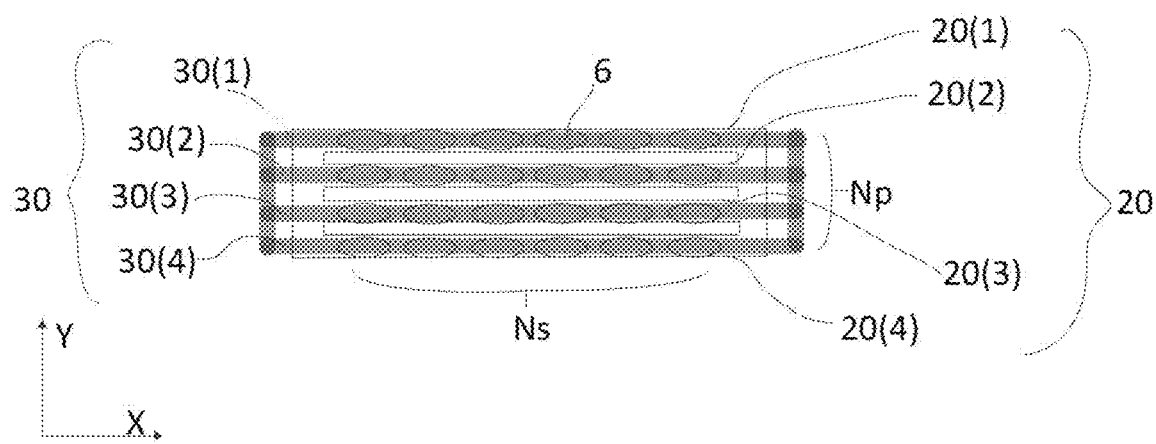
FIG. 6b is a connection diagram of extended parallel-connected magnetoresistive sensing units.

Optionally, each input signal straight wire is expanded into several sub-input signal straight wires arranged in parallel at equal distance and having the same current direction, and the row of magnetoresistive sensing units corresponding to the input signal straight wire is expanded into several rows of sub-magnetoresistive sensing units accordingly. FIG. 6b shows a connection diagram of magnetoresistive sensing units connected in parallel. The plurality of magnetoresistive sensing unit strings 30(1), 30(2), 30(3) and 30(4) shown in FIG. 6a are connected in parallel with one another to form a two-port structure 30, and the input signal straight wires 20 are also expanded into 20(1), 20(2), 20(3) and 20(4) straight wires and correspond to the magnetoresistive sensing unit strings 30 one by one, that is, Ns magnetoresistive sensing units are expanded into Ns*Np arrays of magnetoresistive sensing units. The usefulness of this parallel structure is that the current that can pass through a single magnetoresistive sensing unit is small, which is at the microampere level, so increasing the number of parallel connections can increase the maximum current quantity of the constant current source and also increase the voltage of the output signal.

Figure 7:
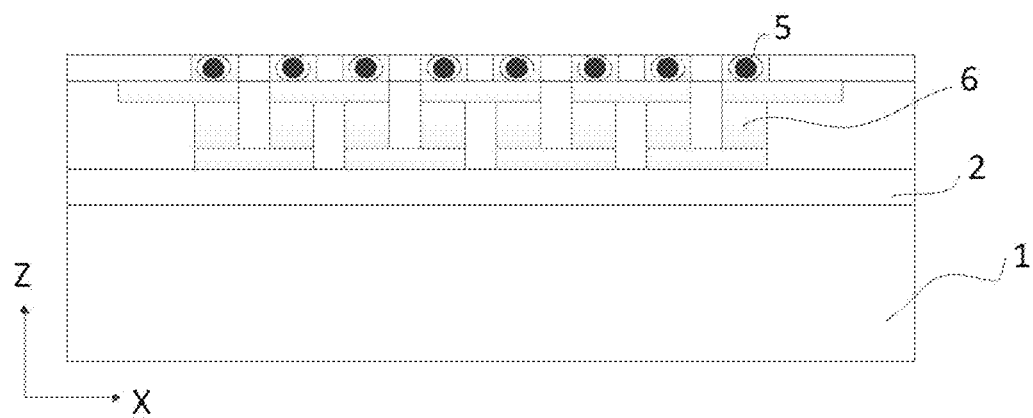
FIG. 7 is a schematic cross-section diagram of a gain-controllable magnetoresistive analog amplifier provided by an embodiment of the present disclosure.

Referring to FIG. 7, a cross-sectional structure of a gain-controllable magnetoresistive analog amplifier is shown. In the figure, 1 is the substrate, 2 is the input signal straight wire corresponding to the input signal coil with the current direction in the X direction, 6 is the magnetoresistive sensing unit string, and 5 is the gain straight wire corresponding to the gain adjustment coil with the current direction in the Y direction. The substrate 1, the input signal coil 2, the magnetoresistive sensor 6, and the gain adjustment coil 5 are set in sequence in a laminated manner.

Figure 8:
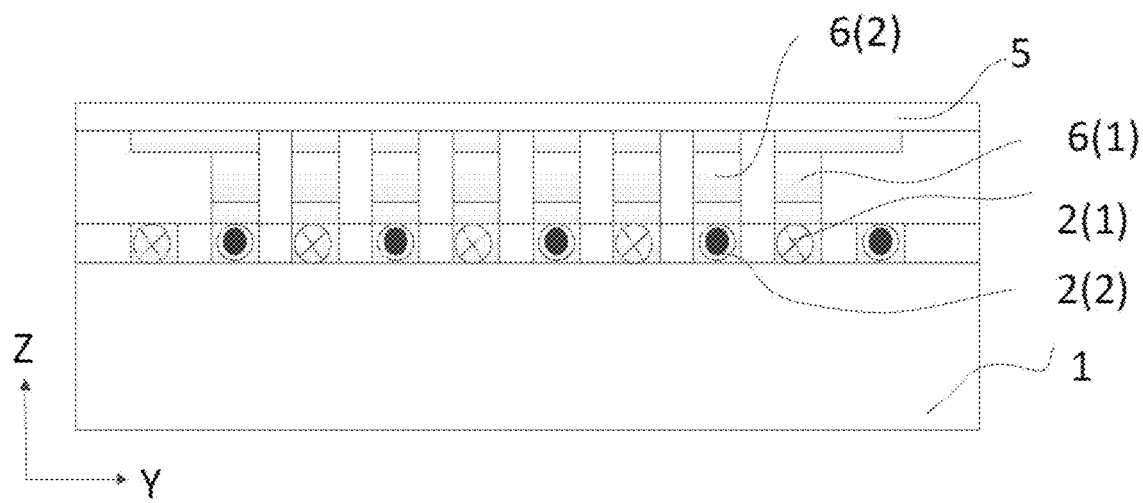
FIG. 8 is a schematic cross-section diagram of a gain-controllable magnetoresistive analog amplifier provided by an embodiment of the present disclosure.

Referring to FIG. 8, a cross-sectional structure of a gain-controllable magnetoresistive analog amplifier is shown. In the figure, 1 is the substrate, 2(1) and 2(2) are respectively two adjacent input signal straight wires with opposite current directions and corresponding to the input signal coil, with the current directions of +X and −X, corresponding to two adjacent magnetoresistive sensing unit strings 6(1) and 6(2), respectively, and 5 is the gain straight wire corresponding to the gain adjustment coil, with the current direction of Y. FIG. 7 and FIG. 8 show two cross-sectional structure diagrams of a magnetoresistive analog amplifier, and there are a variety of structures of the magnetoresistive analog amplifier, so the cross-sectional structures are therefore not limited to those shown in FIG. 7 and FIG. 8.

Figure 9:
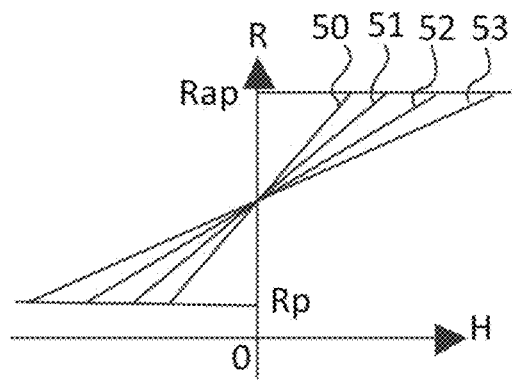
FIG. 9 is a schematic diagram of the principle of gain adjustment of the
    input resistance-magnetic field transfer curve of the magnetoresistive sensor in the embodiments of the present disclosure.

Referring to FIG. 9, the diagram of adjustment principle of the R-H transfer characteristic curve of the magnetoresistive sensing unit is shown. In the figure, Rap is the resistance when the free layer and the pinned layer are in opposite directions, and Rp is the resistance when the free layer and the pinned layer are in the same direction. The increase of gain current leads to the increase of free layer bias magnetic field, and the slope decreases, with the increase of gain current, the resistor R-magnetic field H curve is 50, 51, 52, and 53 sequentially, and the magnetic field sensitivity decreases gradually.

Optionally, for the magnetoresistive analog amplifier shown in FIGS. 1 and 4, wherein the push arm is powered by the push current source and the pull arm is powered by the pull current source, the push arm and the pull arm have a common ground terminal, the push output signal terminal is located between the push current source and the push arm, the pull output signal terminal is located between the pull current source and the pull arm, and the output signal is obtained by the signal difference between the push output signal terminal and the pull output signal terminal. The way of electrical connection is shown with reference to FIG. 10. Optionally, for the magnetoresistive analog amplifiers described in any of the above embodiments, the magnetization directions of the pinned layer the free layer that form the output signal magnetoresistive sensor are perpendicular to each other.

Figure 10:
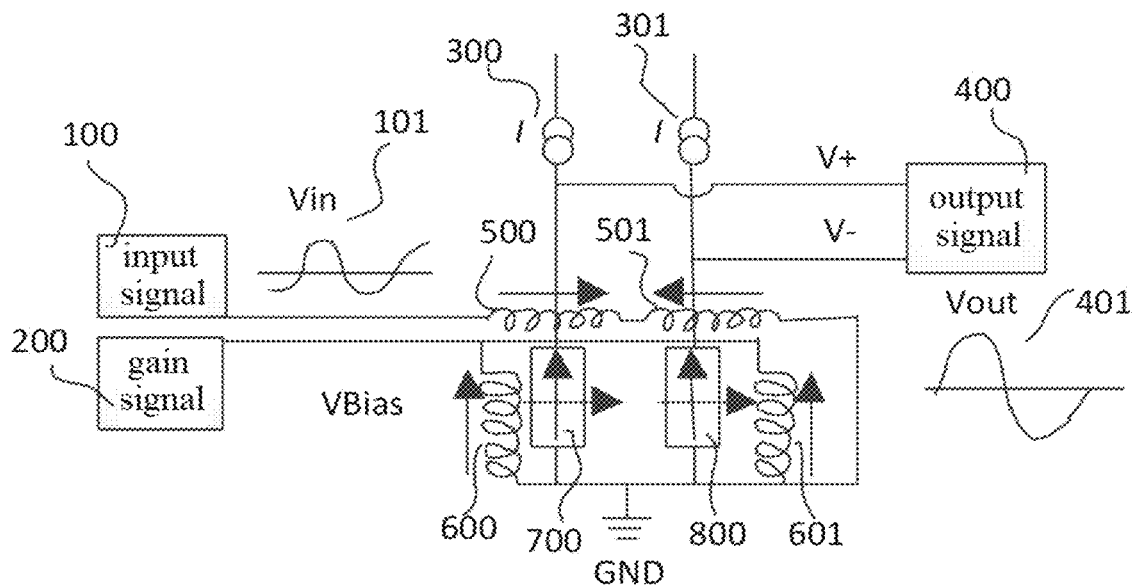
FIG. 10 is a schematic diagram of electrical connections of a gain-controllable magnetoresistive analog amplifier provided by an embodiment of the present disclosure.

As shown in FIG. 10, a push magnetoresistive sensing unit arm 700 and a pull magnetoresistive sensing unit arm 800 have the same magnetic field sensitivity direction and are powered by a current source 300 and a current source 301 respectively at one end, and the input signals of the two current sources are completely the same, and the other ends are connected to a common ground. Input signal coils 500 and 501 respectively generate input magnetic fields that are applied to the magnetic field sensitivity direction of the push magnetoresistive sensing unit arm 700 and the pull magnetoresistive sensing unit arm 800, respectively, and 100 is the input signal connected to the input signal coils 500 and 501. Gain adjustment coils 600 and 601 are applied to the gain coils of the push magnetoresistive sensing unit arm 700 and the pull magnetoresistive sensing unit arm 800, respectively, to generate a bias magnetic field perpendicular to the magnetic field sensitivity direction for adjusting the magnetic field sensitivity of the magnetoresistive sensing unit, and 200 is a gain signal source connected to the gain adjustment coils 600 and 601. An output signal V+ is connected between the push magnetoresistive sensing unit arm 700 and the current source 300, and an output signal V− is connected between the pull magnetoresistive sensing unit arm 800 and the current source 301, and an output signal circuit 400 is connected for differential output.

Optionally, for the magnetoresistive analog amplifiers shown in FIG. 2, FIG. 3, and FIG. 5, wherein one end of the single arm is powered by a current source and the other end is connected to ground, the single arm output signal terminal is located between the current source and the single arm, and the single arm output signal terminal is connected to a capacitor to obtain an output signal. The way of the electrical connection is shown with reference to FIG. 11. Optionally, for the magnetoresistive analog amplifier described in any preceding embodiment, the magnetization directions of the pinned layer and the free layer that form the output signal magnetoresistive sensor are perpendicular to each other.

Figure 11:
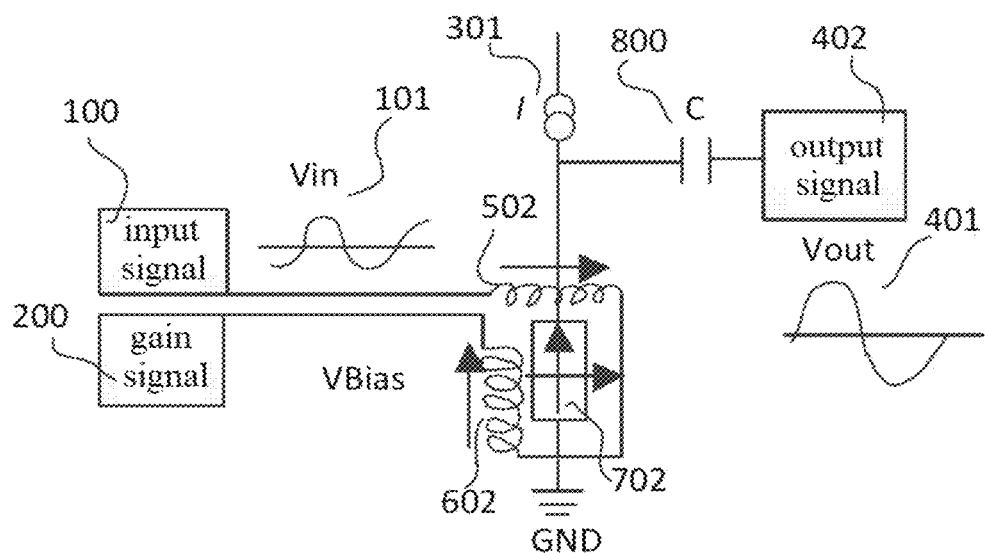
FIG. 11 is a schematic diagram of electrical connections of a gain-controllable magnetoresistive analog amplifier provided by an embodiment of the present disclosure.

As shown in FIG. 11, a single magnetoresistive sensing unit arm 702 is powered by a current source 302 at one end and is connected to ground at the other end. An input signal coil 502 generates an input magnetic field that is applied to the magnetic field sensitive direction of the single magnetoresistive sensing unit arm 702, and 100 is the input signal connected to the input signal coil 502. A gain adjustment coil 602 is applied to the single magnetoresistive sensing unit arm 702, generating a bias magnetic field perpendicular to the magnetic field sensitivity direction for adjusting the magnetic field sensitivity of the magnetoresistive sensing unit, and 200 is the gain signal source connected to the gain coil 602. An output signal connection capacitor 800 is connected between the single magnetoresistive sensing unit arm 702 and the current source 302 to filter out the direct current voltage, and an output signal circuit 402 is connected for output.

It is noted that the above is only preferred embodiments of the present disclosure and technical principles utilized. It will be understood by those skilled in the art that the present disclosure is not limited to the specific embodiments described herein, and those skilled in the art can make various obvious variations, readjustments, inter-combinations, and substitutions without departing from the scope of protection of the present disclosure. So, while the present disclosure is described in more detail by the above embodiments, the present disclosure is not limited to the above embodiments, but it may also include more other equivalent embodiments without departing from the conception of the present disclosure, and the scope of the present disclosure is determined by the scope of the appended claims.

The invention claimed is:

1. A gain-controllable magnetoresistive analog amplifier, comprising:
    a substrate located in an X-Y plane;
    an output signal magnetoresistive sensor located on the substrate; and
    an input signal coil and a gain adjustment coil, the input signal coil and the gain adjustment coil located on two side surfaces of the output signal magnetoresistive sensor, respectively,
    wherein,
    the gain adjustment coil is used to input a gain signal by the generation of a gain magnetic field, in order to set the gain magnetic field is applied along a magnetization direction of a free layer of the output signal magnetoresistive sensor, thereby adjusting the slope of the input resistance-magnetic field transfer curve of the output signal magnetoresistive sensor, and
    the input signal coil is used for inputting a current signal to generate an input magnetic field, in order to apply the input magnetic field to a magnetization direction of a pinned layer of the output signal magnetoresistive sensor, thereby controlling the gain signal to adjust a gain factor of an output signal after the current signal passes through the output signal magnetoresistive sensor, and the current signal is alternate current signal or direct current signal.

2. The magnetoresistive analog amplifier according to claim 1, wherein the output signal magnetoresistive sensor comprises 1 M row*N column magnetoresistive sensing unit array;
    the input signal coil is curved serpentine-shaped and contains M+2 input signal straight wires with opposite current directions and alternately arranged, the long axis of the input signal straight wires is parallel to the X direction and the short axis is parallel to the Y direction, and the current direction of the input signal straight wires is parallel to the X direction;
    the M rows of magnetoresistive sensing units of the output signal magnetoresistive sensor are respectively set in correspondence with M input signal straight wires located in the middle of the M+2 input signal straight wires, M/2 rows of magnetoresistive sensing units corresponding to M/2 input signal straight wires having the same first current direction in the M input signal straight wires are connected to form a push arm, M/2 rows of magnetoresistive sensing units corresponding to M/2 input signal straight wires having the same second current direction in the M input signal straight wires are connected to form a pull arm, and the first current direction is opposite to the second current direction; and
    M is an even number.

3. The magnetoresistive analog amplifier according to claim 2, wherein each of the input signal straight wires is expanded into several sub-input signal straight wires arranged in parallel at equal distance and having the same current direction, and the row of magnetoresistive sensing units corresponding to the input signal straight wire is accordingly expanded into several rows of sub-magnetoresistive sensing units.

4. The magnetoresistive analog amplifier according to claim 2, wherein the push arm is powered by a push current source and the pull arm is powered by a pull current source, the push arm and the pull arm have a common ground terminal, a push output signal terminal is located between the push current source and the push arm, a pull output signal terminal is located between the pull current source and the pull arm, and an output signal is obtained by the signal difference between the push output signal terminal and the pull output signal terminal.

5. The magnetoresistive analog amplifier according to claim 1, wherein the output signal magnetoresistive sensor comprises 1 M row*N column magnetoresistive sensing unit array;
    the input signal coil is curved serpentine-shaped and contains 2M+2 input signal straight wires with opposite current directions and alternately arranged, the long axis of the input signal straight wires is parallel to the X direction and the short axis is parallel to the Y direction, and the current direction of the input signal straight wires is parallel to the X direction;
    the M rows of magnetoresistive sensing units of the output signal magnetoresistive sensor are respectively set in correspondence with M input signal straight wires in the middle of the 2M+2 input signal straight wires and with the same current direction, and the M rows of magnetoresistive sensing units are connected to form a single arm.

6. The magnetoresistive analog amplifier according to claim 5, wherein one end of the single arm is powered by a current source and the other end is connected to a ground terminal, a single arm output signal terminal is located between the current source and the single arm, and an output signal is obtained by connecting a capacitor to the single arm output signal terminal.

7. The magnetoresistive analog amplifier according to claim 1, wherein the output signal magnetoresistive sensor comprises 1 M row*N column magnetoresistive sensing unit array;
    the input signal coil is grid-shaped and contains M+2 input signal straight wires with the same current direction and arranged in parallel at equal distance, the long axis of the input signal straight wires is parallel to the X direction and the short axis is parallel to the Y direction, and the current direction of the input signal straight wires is parallel to the X direction; and
    the M rows of magnetoresistive sensing units of the output signal magnetoresistive sensor are respectively set in correspondence with M input signal straight wires located in the middle of the M+2 input signal straight wires, and the M rows of magnetoresistive sensing units are connected to form the single arm.

8. The magnetoresistive analog amplifier according to claim 1, wherein the output signal magnetoresistive sensor comprises 2 M row*N column magnetoresistive sensing unit arrays;
the input signal coil is planar spiral-shaped and contains an input signal first region with M rows of input signal straight wires arranged in parallel at equal distance and an input signal second area with M rows of input signal straight wires arranged in parallel at equal distance, the input signal straight wires in the input signal first region and the input signal second region having opposite current directions, the long axis of the input signal straight wires being parallel to the X direction and the short axis being parallel to the Y direction, the current direction of the input signal straight wires being parallel to the X direction; and
a row of magnetoresistive sensing units is set in correspondence with one of the input signal straight wires, M rows of magnetoresistive sensing units corresponding to the M input signal straight wires in the input signal first region are connected to form a push arm, and M rows of magnetoresistive sensing units corresponding to the M input signal straight wires in the input signal second region are connected to form a pull arm.

9. The magnetoresistive analog amplifier according to claim 1, wherein the output signal magnetoresistive sensor comprises 1 M row*N column magnetoresistive sensing unit array;
the input signal coil is planar spiral-shaped and contains one input signal region, the input signal region having M rows of input signal straight wires arranged in parallel at equal distance and having the same current direction, the long axis of the input signal straight wires being parallel to the X direction and the short axis being parallel to the Y direction, the current direction of the input signal straight wires being parallel to the X direction; and
a row of magnetoresistive sensing units is set in correspondence with one of the input signal straight wires, and the M rows of magnetoresistive sensing units are connected to form a single arm.

10. The magnetoresistive analog amplifier according to claim 1, wherein the output signal magnetoresistive sensor comprises 1 M row*N column magnetoresistive sensing unit array;
the gain adjustment coil is grid-shaped and contains N+2 gain straight wires arranged in parallel at equal distance and having the same current direction, the long axis of the gain straight wires being parallel to the Y direction and the short axis being parallel to the X direction, the current direction of the gain straight wires being parallel to the Y direction; and
N columns of magnetoresistive sensing units of the output signal magnetoresistive sensor are respectively set in correspondence with the N gain straight wires located in the middle of the N+2 gain straight wires.

11. The magnetoresistive analog amplifier according to claim 1, wherein the magnetization directions of the pinned layer and the free layer that form the output signal magnetoresistive sensor are perpendicular to each other.

* * * * *